United States Patent [19]

Maeda et al.

[11] Patent Number: 4,638,985
[45] Date of Patent: Jan. 27, 1987

[54] SHEET HOLDING APPARATUS

[75] Inventors: Yoshinobu Maeda, Katano; Kohji Fujiwara, Yamatokouriyama; Takao Naito, Katano, all of Japan

[73] Assignee: Matsushita Electric Industrial Co., Ltd., Kadoma, Japan

[21] Appl. No.: 790,454

[22] Filed: Oct. 23, 1985

[51] Int. Cl.⁴ .............................. B25B 1/10; B25B 5/10
[52] U.S. Cl. ....................................... 269/244; 269/903; 269/52
[58] Field of Search ................. 269/52, 250, 244, 903; 29/559

[56] References Cited

U.S. PATENT DOCUMENTS

| | | | |
|---|---|---|---|
| 1,335,721 | 4/1920 | Bergstrom | 269/250 X |
| 3,665,986 | 5/1972 | Johnson | 269/244 |
| 4,030,717 | 6/1977 | Serlovsky | 269/903 X |
| 4,050,685 | 9/1977 | Cox | 269/903 X |
| 4,074,422 | 2/1978 | Borjesson et al. | 269/903 X |
| 4,154,998 | 5/1979 | Luft et al. | 269/903 X |
| 4,231,557 | 11/1980 | Blachly | 269/244 X |
| 4,330,113 | 5/1982 | Ferdinand et al. | 269/244 X |
| 4,527,786 | 7/1985 | Hsu | 269/244 X |

FOREIGN PATENT DOCUMENTS 612556  1/1961  Canada .................. 269/52

Primary Examiner—Charlie T. Moon
Attorney, Agent, or Firm—Cushman, Darby & Cushman

[57] ABSTRACT

In a sheet holding apparatus having a pair of parallelly disposed rails (17, 18) for sliding a sheet, such as a printed board, and plural guide holders (38, 42) having plural positioning guide pin (40, 44) to be inserted in holes of the printed wiring board, distance between the pair of rails (17, 18) is changed by a screw shaft (20) which is rotated by a driving motor (32) responding to change of size of the sheet, and a spline shaft (36) is disposed along the rails (17, 18), and the guide holders (32, 42) are provided to be slidable on the spline shaft (36), which puts up and down the guide holders (32, 42), hence positioning guide pins (40, 44) above and below a level of carrying plane of the sheet by rotation thereof.

6 Claims, 9 Drawing Figures

SHEET HOLDING APPARATUS

BACKGROUND OF THE INVENTION

1. FIELD OF THE INVENTION

The present inention relates generally to a sheet holding apparatus which is for holding a sheet such as a printed wiring board or the like, and especially to a sheet holding apparatus wherein the sheet holding position is easily, efficiently and precisely changeable responding to the change of the sheet metal size.

2. DESCRIPTION OF THE PRIOR ART

The conventional sheet holding apparatus is constructed as shown in FIG. 1 and FIG. 2. Rails 4 and 5 are fixed on a table 1 by putting blocks 2 and 3 by screw bolts 6 inbetween. A shaft 7 is rotatably held on the block 3, and a driving lever 8 is connected with an end part of the shaft 7, so as to receive an external force. Guide holders 9 are fixed on the shaft 7 by screw bolts 12. On the tip part of the guide holders 9, positioning guide pins 10 are fixed. In normal state the guide holders 9 are horizontally supported by springs 13, and at the same time the positioning guide pins 10 are vertically supported.

In the sheet metal holding apparatus shown in FIG. 1 and FIG. 2, when the external force is given on the driving lever 8, the shaft 7 and the guide holders 9 are rotated counterclockwise as shown in FIG. 2, so the positioning guide pins 10 are put down below a level of a carrying plane 15 of sheet 14. The sheet 14 is brought in as shown by arrow mark in FIG. 1 by a cylinder, a belt, a chain or the like known transfer means which are not drawn in figures, and the sheet 14 is stopped at the position which is shown in FIG. 1. Next, by taking off the external force from the driving lever 8, the shaft 7 and the guide holders 9 are rotated clockwise, and the positioning guide pins 10 are inserted into holes 16 of the sheet 14 to hold the latter at a predetermined position as shown in FIG. 1.

However, in case of changing for different size of the sheet 14, the distance between the rails 4 and 5, and the distance between each guide holders 9 must be changed.

Recently, a mode of manufacturing of many kinds but fewer number become popular, changing the sizes of the sheet becomes more frequent. In case of using the conventional apparatus, the manufacturing operation must be stopped and the holding position is necessary to adjust by human hands. So it becomes a problem that operation efficiency of the apparatus in manufacturing goes down.

SUMMARY OF THE INVENTION

Accordingly, the purpose of the present invention is to provide a sheet holding apparatus, especially being easily, efficiently and precisely changeable of the holding positions responding to the change of the size of the sheet.

A sheet holding apparatus in accordance with the present invention comprises a pair of rails for slidably holding edge parts of a sheet, disposed parallel each other in a direction of transfer of the sheet, at least one rail being movable in a direction lateral thereto to adjust distance between the pair of rails, plural guide holders at least one thereof being movable in a direction along the rails to adjust distance therebetween, plural positioning guide pins fixed on a tip part of the guide holders, and being to be inserted into holes of the sheet to hold the sheet at a predetermined position, driving means for driving at least one of the rail and one of the guide holder.

DESCRIPTION OF THE PREFERRED EMBODIMENTS

A first preferred embodiment of the present invention is described with reference to FIG. 3, FIG. 4, FIG. 5 and FIG. 6.

Figure 1:
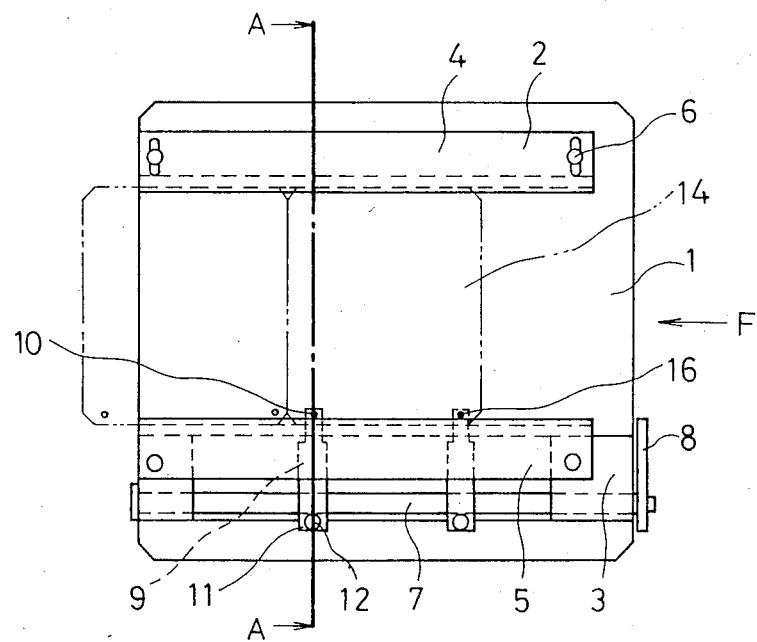
FIG. 1 is the schematic plan view of the conventional sheet holding apparatus.
Figure 2:
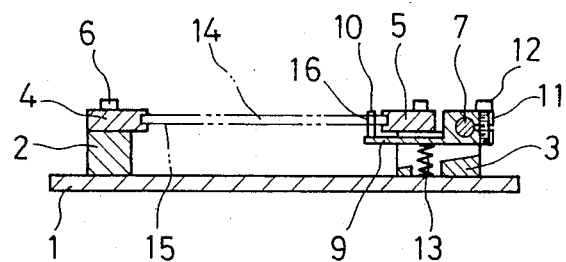
FIG. 2 is the cross-sectional view of section A—A of the conventional sheet holding apparatus shown in FIG. 1.
Figure 3:
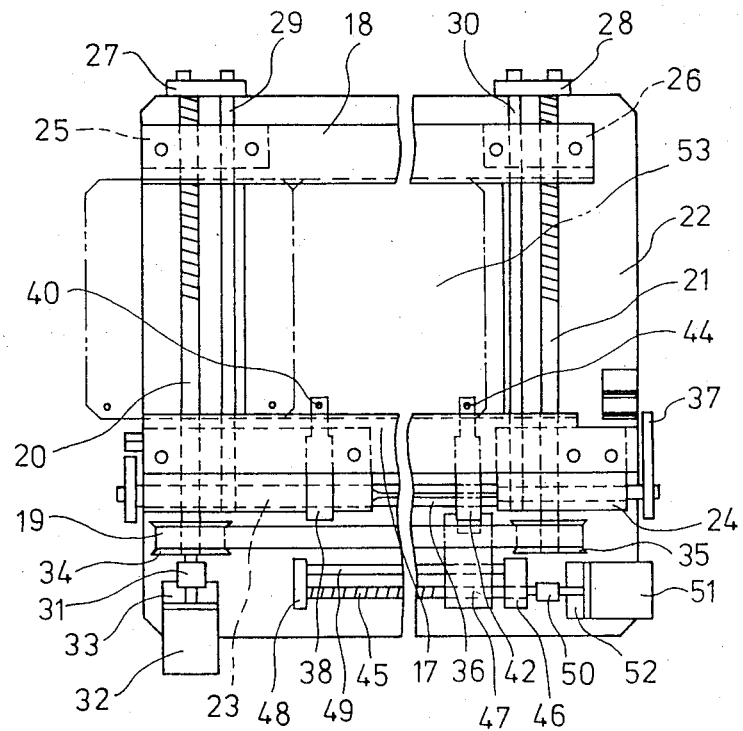
FIG. 3 is a plan view of a sheet holding apparatus in accordance with the present invention.
Figure 4:
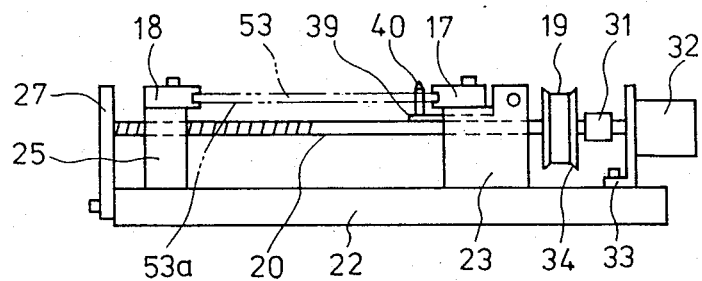
FIG. 4 is a side view of the sheet holding apparatus shown in FIG. 3.
Figure 5:
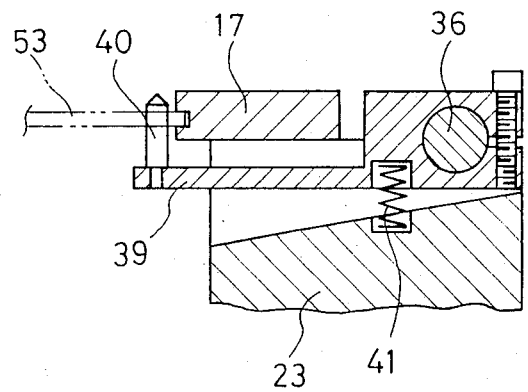
FIG. 5 is a cross-sectional view of the non-movable guide holder 39 shown in FIG. 3.
Figure 6:
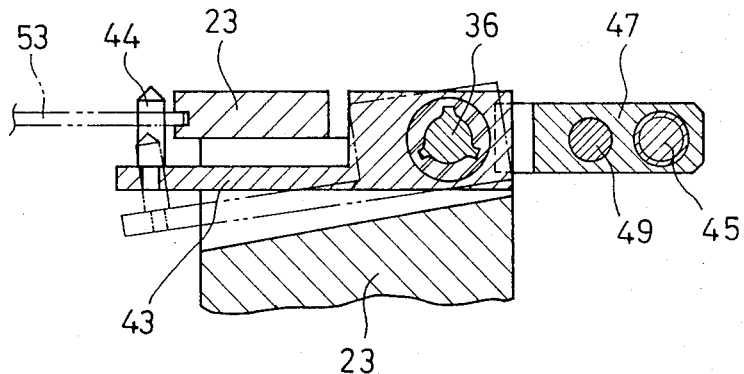
FIG. 6 is a cross-sectional view of the movable guide holder 43 shown in FIG. 3.

A sheet holding apparatus in accordance with the present invention is fixed on a movable table which moves along Cartesian coodinates (which is not drawn in figures). As shown in FIG. 3 and FIG. 4, the sheet metal holding apparatus comprises, a fixed rail 17 which is fixed on blocks 23 and 24 which are provided on a base 22, a movable rail 18 which is fixed on sliders 25 and 26, a motor 32 which is fixed on the base 22 by a blacket 33 and connected with a screw shaft 20 by a coupler 31, and a screw shaft 21 which is driven synchronously the motor 32 by means of a timing pullies 34, 35 and a timing belt 19. Furthermore, the apparatus has guide shafts 29 and 30 which are held by plates 27, 28 which are holding screw shafts 20 and 21 through the blocks 23, 24 and the sliders 25, 26, respectively. A spline shaft 36 is rotatably held by the blocks 23 and 24. A driving lever 37 is fixed on the edge part of the spline shaft 36. An engaged guide holder 38 is cradably engaged to the block 23 in a manner not to move in lengthwise of the spline shaft 36. A movable guide holder 42 is connected with the spline shaft 36 in a lengthwise slidable manner between the driving lever 37 and the engaged guide holder 38. A screw shaft 45 is rotatably hold by blacket 46 and 48 along the spline shaft 36. A sliding blocks 47 is connected with the screw shaft 45 in the relation of screw and nut. A guide shaft 49 is also held by the blackets 46 and 48 through the sliding block 47. A motor 51 is connected with the screw shaft 45 by a coupler 50 and fixed to a blacket 52 providing on the base 22. And, as shown in FIG. 5, a positioning guide pin 40 is fixed on the tip part of the engaged guide holder 38, and in normal state the engaged guide holder 38 is horizontally supported by a pressure spring 41 and the positioning guide pin 40 is vertically supported. As shown in FIG. 6, a positioning guide pin 44 is fixed on the tip part of the movable holder 42.

In case of adding the external force on the driving lever 37, the spline shaft 36 is rotated, and the engaged guide holder 38 and the movable holder 42 are rotated by the spline shaft at the same time. So, the positioning guide pins 40 and 44 go down below the carring plane 53a of the sheet 53, and sheet 53 becomes to be able to take out from or to put into the transfer space between the rails 17 and 18, without being prevented by the positioning guide pins 40 and 44 or the like. And next, by removing the external force from the driving lever 37, the positioning guide pins 40 and 44 are brought up, and the sheet 53 is supported at the predetermined regular position by inserting of the positioning guide pins into the two holes of the sheet 53.

Hereupon, when size of the sheet 53 is changed, the screw shafts 20 and 21 are synchronously rotated by the motor 32, and the movable rail 18 is moved in parallel to the fixed rail 17 by the rotation of the screw shafts 20 and 21. Therefore, the distance between the rails 17 and 18 is changed. Further, when the screw shaft 45 is rotated by the motor 51, the movable guide holder 42 is shifted along the spline shaft 36 through moving of the sliding block 47. Thus, the position of the positioning guide pin 44 is automatically changed. As mentioned above, the sheet holding apparatus in accordance with the present invention can change the holding position of the sheet easily and quickly responding to the size of the change of the sheet.

Furthermore, an air cylinder can be used instead of the motor 51 and the screw shaft 45 to shift the movable holder 42 in case a small number of positioning guide pins is sufficient.

Next, a second preferred embodiment of the present invention is described with reference to FIG. 7 and FIG. 8. The same numerals as those in the first embodiment designate corresponding parts and components and act the same operation.

Figure 7:
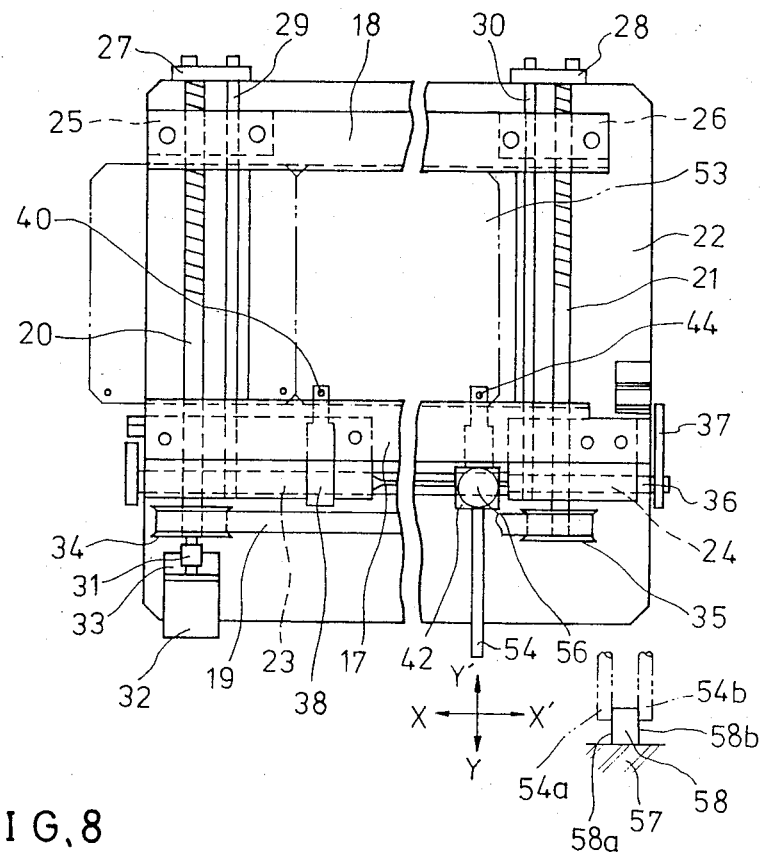
FIG. 7 is a plan view of another sheet holding apparatus in accordance with the present invention.
Figure 8:
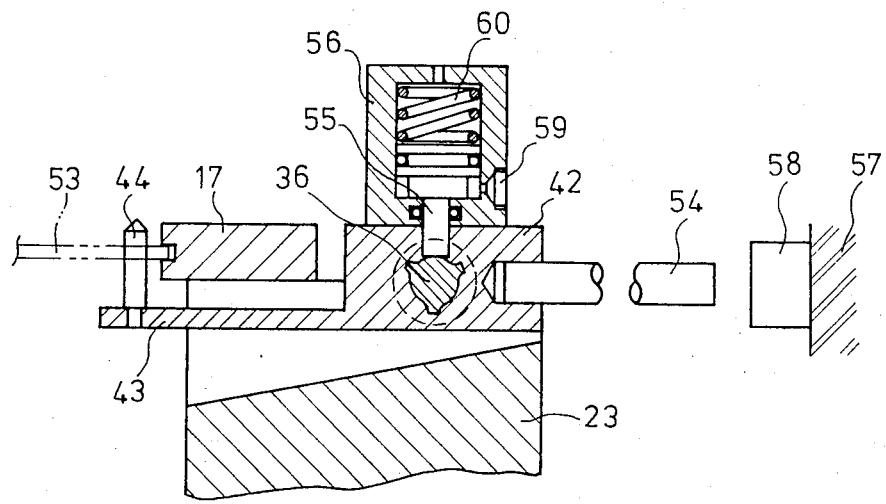
FIG. 8 is a cross-sectional view of the aircylinder shown in FIG. 7.

The differences between FIG. 7 and FIG. 3 are as follows: First, the sheet holding apparatus shown in FIG. 7 does not have such driving means for the movable guide holder 42 as that of FIG. 3 which comprises the motor 51, screw shaft 45, guide shaft 49, etc. Second, the sheet holding apparatus has a driving rod 54 for moving the movable guide holder 42 along the spline shaft 36, and an air cylinder 56 for fixing the movable guide holder 42 on the spline shaft 36. And third, a fixed pin 58 is provided on the fixed base 57 of the movable table which moves along Cartesian coodinates which is not drawn in figures.

The operation is as follows. The sheet metal folding apparatus shown in FIG. 7, shifting of the positioning guide pin 44 for the direction designated by X, can be done only by moving the whole apparatus to a position designated by numerals 54a, and further moving in X' direction by a predetermined distance. On the contrary, to shift the positioning guide pin 44 in the direction designated by X', the whole apparatus is moved to the position which is designated by 54b, and further moved by a predetermined distance. During the moving of the whole apparatus, the movable guide holder 42 is not fixed and freely movable along the spline shaft 36 by providing compressed air from an air inlet 59 into the air cylinder 56. Namely, in the air cylinder 56, the provided compressed air raises piston 55 against a pressure spring 60, and a lower end of the piston 54 released the spline shaft 36. After rightly positioning the position of the movable guide holder 42, by stopping the provision of the compressed air the pressure spring 60 presses the piston 55 and the lower end of the piston 55 clamps the spline shaft 36 to fix the movable guide holder 42.

Figure 9:
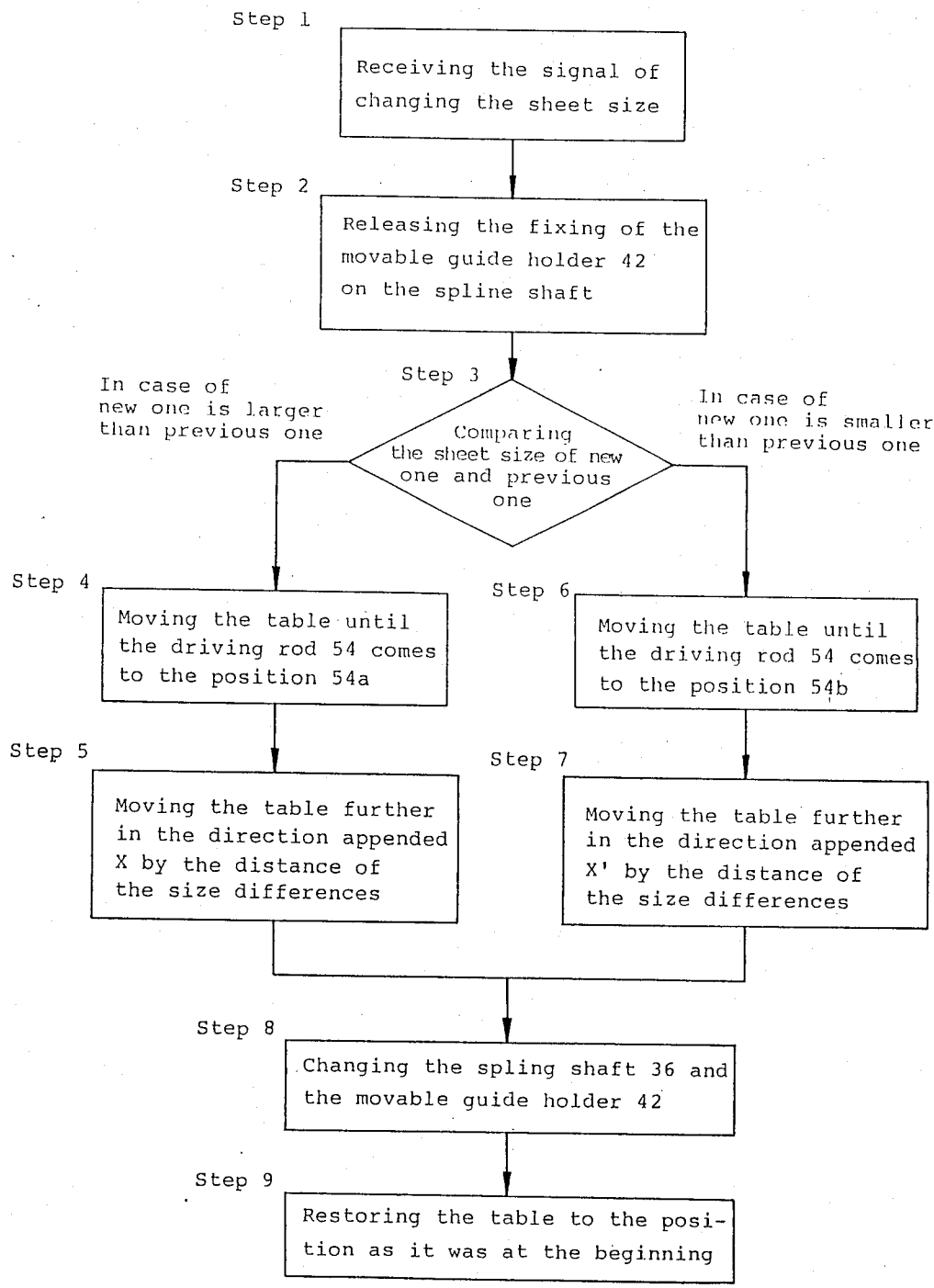
FIG. 9 is a flow chart of changing operation of holding position of a sheet in the sheet holding apparatus shown in FIG. 7.

FIG. 9 is a flow chart which explains the changing operation of the holding position of the sheet in accordance with the second preferred embodiment.

In step 1, control means of the sheet holding apparatus (which is not drawn in figures) receives the signal of changing the sheet size.

In step 2, the control means prevents supply of the compressed air into the air cylinder 56, and hence releases the fixing of the movable guide holder 42 on the spline shaft 36.

In step 3, the control means compares the sheet size of new one and previous one.

In step 4, wherein distance between the holes of the new sheet is narrower than that of the previous sheet, the movable table, on which the sheet holding apparatus is fixed, is moved until the driving rod 54 comes to the position 54a.

In step 5, the movable table is further moved in the direction appended X by the distance of the size difference.

In step 6, wherein the distance between the holes of the new sheet is wider than that of the previous sheet, the movable table is moved until the driving rod 54 comes to the position 54b.

In step 7, the movable table is further moved in the direction X' by the distance of the size difference.

In step 8, after positioning the movable guide holder 42, the control means stops supply of the compressed air, and means of the pressure spring 60 the piston 55 clamps the spline shaft 36 and the movable guide holder 42 fixes.

In step 9, the movable table is restored to such a position as it was at the beginning.

What is claimed is:

1. A sheet holding apparatus comprising:
   a pair of interconnected rails supported on a base for slidably holding edge parts of a sheet, disposed parallel to each other in a direction of transfer of said sheet, at least one of said rails being movable in a direction lateral thereto, to adjust distance between said pair of rails,
   plural guide holders, at least one thereof being movable in a direction along said rails, to adjust distance therebetween to correspond to holes of said sheet,
   plural positioning guide pins fixed on said guide holders, and being adapted to be inserted into holes of said sheet to hold said sheet at a predetermined position,
   driving means for driving at least one rail and one guide holder.

2. A sheet holding apparatus in accordance with claim 1, wherein
   said driving means is an electric motor.

3. A sheet holding apparatus in accordance with claim 1, further having
   a spline shaft disposed in a lengthwise dierection of said rails,
   said plural guide holders are slidably connected with said spline shaft.

4. A sheet holding apparatus comprising:
   a pair of interconnected rails for holding edge parts of a sheet, disposed parallel to each other in a direction of transfer of said sheet, at least one rail being adjustably movable in a direction lateral thereto, plural guide holders, at least one guide holder being adjustably movable in a direction along said rails to correspond to holes of said sheet.

plural positioning guide pins being fixed on said guide holders, being adapted to be inserted into holes of said sheet to hold said sheet at a predetermined position, a driving rod which is projecting from said at least one of said guide holders, a base for holding said rails and plural guide holders, and being movable in Cartesian coodinates, a fixed pin to be contacted with said driving rod, and being free from said base.

5. A sheet holding apparatus in accordance with claim 4, further having a spline shaft disposed along a lengthwise direction of said rails, and said plural guide holders are slidably connected with said spline shaft.

6. A sheet holding apparatus in accordance with claim 5, further having fixing means for fixing and releasing at least one of said plural guide holders on said spline shaft.

* * * * *